(12) United States Patent
Watson et al.

(10) Patent No.: US 11,873,253 B2
(45) Date of Patent: Jan. 16, 2024

(54) CERAMIC

(71) Applicants: XAAR TECHNOLOGY LIMITED, Cambridge (GB); IONIX ADVANCED TECHNOLOGIES LTD, Leeds (GB)

(72) Inventors: Michael Watson, Cambridge (GB); Angus Condie, Cambridge (GB); Timothy Paul Comyn, Huddersfield (GB); Andrew Bell, Huddersfield (GB)

(73) Assignee: Xaar Technology Limited, Cambridge (GB)

( * ) Notice: Subject to any disclaimer, the term of this patent is extended or adjusted under 35 U.S.C. 154(b) by 972 days.

(21) Appl. No.: 16/612,903

(22) PCT Filed: May 10, 2018

(86) PCT No.: PCT/GB2018/051269
§ 371 (c)(1),
(2) Date: Nov. 12, 2019

(87) PCT Pub. No.: WO2018/206969
PCT Pub. Date: Nov. 15, 2018

(65) Prior Publication Data
US 2020/0079696 A1    Mar. 12, 2020

(30) Foreign Application Priority Data

May 12, 2017    (GB) .................... 1707686

(51) Int. Cl.
*C04B 35/475*    (2006.01)
*C04B 35/47*    (2006.01)
(Continued)

(52) U.S. Cl.
CPC ........ *C04B 35/475* (2013.01); *B41J 2/14209* (2013.01); *C04B 35/6262* (2013.01);
(Continued)

(58) Field of Classification Search
CPC ............. H01L 41/1878; H01L 41/1871; H01L 41/1875; H01L 41/187; C04B 35/26;
(Continued)

(56) References Cited

U.S. PATENT DOCUMENTS 10,020,442 B2 * 7/2018 Bell ................. H01L 41/187
2008/0290315 A1 11/2008 Lee et al.
(Continued)

FOREIGN PATENT DOCUMENTS

CN    101107128 A    1/2008
CN    101157544 A    4/2008
(Continued)

OTHER PUBLICATIONS

International Search Report and Written Opinion for International Application No. PCT/GB2018/051269 dated Jul. 23, 2018 (11 pages).
(Continued)

*Primary Examiner* — Matthew E. Hoban
*Assistant Examiner* — Lynne Edmondson
(74) *Attorney, Agent, or Firm* — Finnegan, Henderson, Farabow, Garrett & Dunner

(57) ABSTRACT

There is disclosed a piezoelectric ceramic having the composition: $a[PbTiO_3]$-$b[SrTiO_3]$-$c[BiFeO_3]$-$d[(K_xBi_{1-x})TiO_3]$; wherein $0.4<x<0.6$; $0.1<a<0.4$; $0.01<b\leq0.2$; $c\geq0.05$; $d\geq0.01$; and $a+b+c+d=1$ optionally comprising an A- or B-site metal dopant in an amount of up to 2 at. %.

19 Claims, 7 Drawing Sheets

(51) Int. Cl.
*C04B 35/472* (2006.01)
*B41J 2/14* (2006.01)
*C04B 35/626* (2006.01)
*C04B 35/645* (2006.01)

(52) U.S. Cl.
CPC .... *C04B 35/62645* (2013.01); *C04B 35/6455* (2013.01); *B41J 2202/03* (2013.01); *C04B 2235/3234* (2013.01); *C04B 2235/3236* (2013.01); *C04B 2235/3274* (2013.01); *C04B 2235/3296* (2013.01); *C04B 2235/5436* (2013.01); *C04B 2235/6567* (2013.01)

(58) Field of Classification Search
CPC ..... C04B 35/462; C04B 35/47; C04B 35/472; C04B 35/475; C04B 2235/768; C04B 2235/3236; C04B 2235/3274; C04B 2235/3234; C04B 2235/3296; C04B 2235/3272; C04B 2235/3298; C04B 2235/79; C04B 2235/3201; C04B 2235/3213; C04B 2235/3232; C04B 2235/3244; C04B 2235/3256
USPC .................................................. 252/62.9 PZ
See application file for complete search history.

(56) References Cited

U.S. PATENT DOCUMENTS

| | | | | |
|---|---|---|---|---|
| 2013/0207020 | A1* | 8/2013 | Bell | .............. C04B 35/462 264/681 |
| 2014/0181618 | A1 | 6/2014 | Kijima et al. | |
| 2015/0086765 | A1 | 3/2015 | Garg et al. | |
| 2018/0015505 | A1 | 1/2018 | Stevenson et al. | |

FOREIGN PATENT DOCUMENTS

| | | |
|---|---|---|
| CN | 101265081 A | 9/2008 |
| CN | 1837143 A | 1/2009 |
| CN | 101456732 A | 6/2009 |
| CN | 101033133 A | 12/2009 |
| CN | 101684045 A | 3/2010 |
| CN | 101992596 A | 3/2011 |
| CN | 102432285 B | 5/2012 |
| CN | 103080043 A | 5/2013 |
| CN | 104576916 A | 4/2015 |
| CN | 106587992 A | 4/2017 |
| DE | 102007029601 A1 | 1/2009 |
| EP | 0364136 B1 | 4/1990 |
| EP | 2218702 A1 | 8/2010 |
| JP | H 02-150355 A | 6/1990 |
| JP | H04295013 A | 10/1992 |
| JP | H 07-132589 A | 5/1995 |
| JP | H 07-214778 A | 8/1995 |
| JP | H1053465 A | 2/1998 |
| JP | H 11-170507 A | 6/1999 |
| JP | 2001-048646 A | 9/2002 |
| JP | 2004-122770 A | 4/2004 |
| JP | 2011-238710 A | 11/2011 |
| JP | 2013537513 A | 10/2013 |
| JP | 2015-122951 A | 7/2015 |
| JP | 2015-128090 A | 7/2015 |
| JP | 2015138804 A | 7/2015 |
| JP | 2018-512743 A | 5/2018 |
| WO | WO 2012/013956 A1 | 2/2012 |
| WO | WO2012013956 A1 | 2/2012 |
| WO | WO2016/124941 A1 | 8/2016 |

OTHER PUBLICATIONS

Search Report dated Jun. 7, 2018, from the Intellectual Property Office of the United Kingdom corresponding G.B. Application No. 1707686.0 (3 pgs.).

Combined Search and Examination Report dated Nov. 7, 2017, from the Intellectual Property Office of the United Kingdom corresponding G.B. Application No. 1707686.0 (7 pgs.).

Bennett, James, et al. "Variation of Piezoelectric properties and mechanisms across the relaxor-like/Ferroelectric continuum in BiFeO3—(K0. 5Bi0. 5) TiO3—PbTiO3 ceramics." *IEEE transactions on ultrasonics, ferroelectrics, and frequency control* 62.1 (2015): 33-45.

Stevenson, T., et al. "Piezoelectric materials for high temperature transducers and actuators." *Journal of Materials Science: Materials in Electronics* 26.12 (2015): 9256-9267.

Chen, Yu, et al. "Correlation between microstructural evolutions and electrical/mechanical behaviors in Nb/Ce co-doped Pb (Zr0. 52Ti0. 48) O3 ceramics at different sintering temperatures." *Materials Research Bulletin* 94 (2017): 174-182.

Garg, Ajai, and D. C. Agrawal. "Effect of rare earth (Er, Gd, Eu, Nd and La) and bismuth additives on the mechanical and piezoelectric properties of lead zirconate titanate ceramics." *Materials Science and Engineering*: B 86.2 (2001): 134-143.

Tuan, Nguyen Hoang, et al. "Structural, optical, and magnetic properties of lead-free ferroelectric Bi0. 5K0. 5TiO3 solid solution with BiFeO3 materials." Journal of Electronic Materials 46.6 (2017): 3472-3478.

Bennett, J, Bell, AJ orcid.org/0000-0002-2061-3862, Stevenson, TJ et al. (1 more author)(2013) Tailoring the structure and piezoelectric properties of BiFeO3—(K0.5Bi0.5)TiO3—PbTiO3 ceramics for high temperature applications. Applied Physics Letters, 103 (15). 152901. ISSN 0003-6951.

First Office Action for corresponding Chinese Application No. 201880031494, filed May 10, 2018, dated Aug. 25, 2021 (12 pgs) and machine translation (8 pgs).

Notice of Reasons for Refusal for corresponding Japanese Patent Application No. 2019-562571, date of drafting Jun. 1, 2022. (5 pgs.).

Search Report by Industrial Property Cooperation Center for corresponding Japanese Patent Application No. 2019-562571 dated Apr. 5, 2022. (27 pgs.).

* cited by examiner

CERAMIC

This application is a National Stage Entry of International Application No. PCT/GB2018/051269, filed May 10, 2018, which is based on and claims the benefit of foreign priority under 35 U.S.C. § 119 to GB Application No. 1707686.0, filed May 12, 2017. The entire contents of the above-referenced applications are expressly incorporated herein by reference.

The present invention relates to a ceramic comprising (or consisting essentially of) a solid solution that is substantially free of non-perovskite phases containing Bi, K, Ti, Pb, Fe, Sr and O which exhibits piezoelectric behaviour. The invention also relates to processes for the manufacture of the ceramic and to products such as piezoelectric actuators, sensors and energy harvesters in which the ceramic is used.

The invention further relates to droplet deposition heads, such as inkjet printheads, in which piezoelectric actuators comprising the ceramic are used.

Piezoelectric materials generate an electric field in response to applied mechanical strain. The effect is attributable to a change of polarization density within the material. The piezoelectric effect is reversible in the sense that stress or strain is induced when an electric field is applied to the material. Piezoelectric materials find use in a range of devices such as sensors and actuators. Examples of the use of piezoelectric materials include medical ultrasound and sonar, acoustics, vibration control, spark igniters, sensors, energy harvesters, high temperature applications, droplet deposition heads, for example printheads such as inkjet printheads and diesel fuel injectors.

A number of ceramics with a perovskite or tungsten-bronze structure are known to exhibit piezoelectric behaviour. In particular, piezoelectric ceramics with the $ABO_3$ perovskite structure (in which A and B are metal ions) are well known. A notable example of perovskite piezoelectric materials are the lead zirconate titanates of formula (Pb $[Zr_xTi_{1-x}]O_3$), commonly known as PZTs, that exhibit a marked piezoelectric activity and are the most common type of piezoelectric ceramic in use today.

When considering the type of piezoelectric material that may be used for any application there are a number of factors that must be born in mind. Thus, if a material is required to operate at high temperature it should have a Curie temperature in excess of that operational temperature as otherwise the piezoelectric element may depole under the operating conditions and its piezoelectric activity will be lost. Another factor to be considered is the coercive field of a material; to allow practical application of the piezoelectric material in a given external field the coercive field must be in excess of the external field otherwise the polarisation of the piezoelectric field can degrade, if the electric field vector and polarisation vector are not aligned. An ideal piezoelectric material would also be resistant to the strains and stresses applied during device manufacture and operation to allow high yields in production and low failure rates in operation/long device lifetimes. Mechanical strength can also allow thinner device architectures, while stiffness is an important property for applications such as actuators as otherwise efficient displacement of the piezoelectric element would be compromised by crosstalk phenomena.

It can thus be appreciated that there is a need for materials that, as well as exhibiting good piezoelectric activity, also display a range of other properties such as a high coercive field, high coercive stress, good machinability properties, fracture resistance and high Curie temperature to allow access to devices that improve upon those available in the art. For example, materials with improved strength provide improved reliability during operation and are often better able to withstand shaping through, for example, sawing, while higher Curie temperature materials allow access to devices that can be operated or processed at higher temperatures.

In the droplet deposition head industry, where piezoelectric actuators find wide application, there is a growing demand for devices with higher resolution. Piezoelectric actuators for droplet deposition heads commonly feature a plurality of mutually aligned fluidic chambers sawn into a sheet of piezoelectric material. Each chamber therein is provided with at least one nozzle through which droplets of fluid are ejected onto a receiving medium. Electrodes located on the surface of the vertical walls of each fluidic chamber are provided to enable driving (i.e. contraction/expansion/deformation) of the vertical walls when an electric field of a suitable magnitude is applied to the electrodes across the piezoelectric material. In more detail, the external applied field causes the piezoelectric vertical walls of a fluidic chamber to deform generating a change in the volume of the fluidic chamber and, consequently, in the pressure inside the fluidic chamber. A sufficient increase in pressure causes a droplet of fluid to be ejected through the nozzle and onto the receiving medium. State of the art actuators based on sawn PZTs have a resolution in the range of 180-200 dpi (dots per inch). It would be advantageous to increase the resolution, for example to 400 dpi and higher, but realisation of such high-resolution droplet deposition heads has to date been hindered by the availability of piezoelectric materials with suitable characteristics.

One way to realise high resolution droplet deposition heads with piezoelectric actuators would involve producing fluidic chambers with thinner walls. In the case of standard PZT-based actuators the walls of the fluidic chambers are typically at least 60-70 µm thick and to increase resolution it would be desirable to identify new piezoelectric materials that could be machined to thicknesses of around 30 µm or less and that are strong enough to withstand driving. Piezoelectric droplet deposition heads with thin walls typically have to be driven at higher electric fields to achieve drop ejection performance (volume of droplets ejected) equivalent to the lower resolution, thicker wall actuators of the art. This in turn demands that any material suitable for thin wall device fabrication (e.g. by sawing) must also possess a high coercive field because otherwise a loss of piezoelectric activity in the actuator wall would occur when the actuator is driven under high field. Piezoelectric actuators commonly used in droplet deposition heads at present are based on PZT materials that can be driven at maximum drive field of 450 V/mm (29.7 V across 66 µm thick wall). The coercive field of such PZT materials is not high enough (coercive field, Ec~1.5 kV/mm) to allow driving at a higher drive field since at higher fields degradation of the piezoelectric properties of the actuator occurs. A thin wall device architecture also demands that the thin walls are sufficiently stiff as the total work is a compound of the piezoelectric activity, the applied voltage and the stiffness. Accordingly, low stiffness walls will not be able to eject fluid droplets from the fluidic chamber in a reliable way.

It can thus be readily appreciated that producing higher resolution droplet deposition heads with thin wall fluidic chamber device architecture requires a material with manifold properties. Materials with a profile of high strength and a high coercive field, that can withstand sawing are required to ensure sufficient device lifetime and reliability, whilst good piezoelectric activity ensures adequate wall deformation and, as a result, sufficient pressure generation in the fluidic chamber. The walls must also be of sufficient stiffness to ensure adequate fluid droplet ejection while high coercive field/stress properties are needed to provide resistance to depoling under high field driving conditions. In addition to high coercive field/stress properties, a high Curie temperature is important to reduce any loss of activity that may otherwise occur as a result of machining or stress, in combination with increased temperature. Materials with a high Curie temperature allow high temperature production steps to be performed, for instance incorporation of passivation layers, and are compatible with operational temperatures intrinsic to use of materials that require a high temperature to achieve fluid consistency appropriate for jetting.

Solid solutions of formula $x(Bi_{0.5}K_{0.5})TiO_3$-$yBiFeO_{3-z}PbTiO_3$, are described in WO2012/013956 A1, and shown to be piezoelectric materials with a high Curie temperature relative to PZT. Solid solutions of composition $x(Bi_{0.5}K_{0.5})TiO_3$-$yBiFeO_{3-z}PbTiO_3$ were however found to have a piezoelectric activity ($d_{33}$ of up to 175 pC/N) that was not sufficiently high for many applications.

In light of the above described issues, it is an object of the present invention to provide piezoelectric ceramic materials with a combination of high piezoelectric activity (i.e. a Berlincourt $d_{33}$ value of ≥250 pm/V), high Curie temperature ($T_C$, of ≥300° C.) and high fracture toughness ($K_{1C}(\times 10^6)$, of ≥3 MPa×m$^{1/2}$). In preferred cases, the piezoelectric ceramics also display a coercive field, Ec, of modulus≥|1.75| kV/mm; and/or a Vickers hardness ($H_V(\times 10^9)$≥3.5 kgf/mm$^2$; and/or a flexural strength σ≥100 MPa.

The balance of properties such as high piezoelectric activity, high coercive field, high coercive stress, high strength, high stiffness, good machinability and high Curie temperatures of the piezoelectric ceramics of the invention can be modulated to favour the intended application. It is a further object of the present invention to provide new piezoelectric materials that exhibit a combination of properties that allow access to new improved devices such as high resolution droplet deposition heads, energy harvesters and sensors. It is yet a further object of the present invention to provide a method for the production of such new materials.

In a first aspect, the invention provides a piezoelectric ceramic that exhibits a Berlincourt $d_{33}$ value of ≥250 pm/V; a Curie temperature, $T_C$, of ≥300° C.; and a fracture toughness, $K_{1C}(\times 10^6)$, of 3 MPa×m$^{1/2}$. The fracture toughness $K_{1C}(\times 10^6)$ may, for example, be ≥3.5 MPa×m$^{1/2}$, ≥5 MPa×m$^{1/2}$ or ≥7 MPa×m$^{1/2}$.

In preferred embodiments, the piezoelectric ceramic further exhibits a coercive field, Ec, of ≥|1.75| kV/mm or a Vickers hardness $H_V(\times 10^9)$≥3.5 kgf/mm$^2$ or a flexural strength σ≥100 MPa. The flexural strength may, for example, be ≥120 MPa or ≥130 MPa or ≥140 MPa.

Note that the Berlincourt $d_{33}$ value is a value which may be obtained on pellets, (for example, of 10 mm diameter and 1 mm thickness) using the Berlincourt method calibrated by values for PZT bar control samples (for example, of dimensions 1 mm by 1 mm by 3.5 mm poled along the longest dimension) for which $d_{33}$ values have been calculated by resonance according to CENELAC EN 50324-2:2002 (Piezoelectric Properties of Ceramic Materials and Components—Part 2: Methods of Measurement and Properties—Low Power). The method may, for example, be conveniently carried out by a meter such as Wide Range $d_{33}$ Meter (from APC International, USA).

Note further that $d_{33}$ values measured by the Berlincourt method are on average 11% higher than values measured using the resonance method. The difference is a composite of random and systematic error and difference in the measurements, frequency, stress and voltage.

Note also that the Vickers hardness $H_V$ and the fracture toughness $K_{1C}(\times 10^6)$ may be determined on polished (using 1 µm diamond) pellets (for example, of 10 mm diameter and 1 mm thickness) by Vickers indentation testing with a testing instrument (for example, using Wilson Hardness Tukon 1202 tester from Buehler) validated to DIN EN ISO 6507-2.

Note further that the flexural strength a may be determined on polished (using 1 µm diamond) bars (of dimensions 25 mm by 3 mm by 0.5 mm) with a fatigue testing instrument (for example, ElectroPuls E3000 from Instron) calibrated to ISO 7500-1:2004 (by, for example, the UKAS accredited Instron Calibration Laboratory).

The enhanced mechanical properties of the piezoelectric ceramic according to the present invention are intrinsic to the ceramic material viz., they do not arise from the addition of toughening agent or additives or from an intentionally introduced porosity. The ceramic is, therefore, substantially free from toughening agents or additives such as those used to toughen PZT ceramics such as $ZrO_2$, $Al_2O_3$, SiC, fibres, whiskers and the like.

The piezoelectric ceramic may have an intrinsic porosity residual from the sintering process with an average pore size less than or equal to 10 µm, preferably <=5 µm. It may also have a porosity of less than 5%, preferably less than 4%, for example, 3%, 2% or 1% as determined using scanning electron microscopy of polysections by area.

The piezoelectric ceramic according to the invention can be a solid solution, which is substantially free of non-perovskite phases, comprising $PbTiO_3$, $SrTiO_3$, $BiFeO_3$ and $(K_xBi_{1-x})TiO_3$.

In preferred embodiments, the piezoelectric ceramic comprises a solid solution, which is substantially free of non-perovskite phases, of the formula:

$a[PbTiO_3]$-$b[SrTiO_3]$-$c[BiFeO_3]$-$d[(K_xBi_{1-x})TiO_3]$ wherein 0.4≤x≤0.6; 0.1≤a≤0.4; 0.01≤b≤0.2; c≥0.05; d≥0.01; and a+b+c+d=1.

Typically, the ceramic quaternary compositions of the invention are piezoelectric materials that exhibit a high Curie temperature, good piezoelectric activity, high coercive field, high coercive stress and high strength.

The invention also provides a ceramic comprising a solid solution, which is substantially free of non-perovskite phases of the formula

$a[PbTiO_3]$-$b[SrTiO_3]$-$c[BiFeO_3]$-$d[(K_xBi_{1-x})TiO_3]$ wherein 0.4≤x≤0.6; 0.1≤a≤0.4; 0.01≤b≤0.2; c≥0.05; d≥0.01; and a+b+c+d=1, further comprising a dopant in an amount up to 2 at % with respect to either A-site atoms and/or B-sites atoms, for example Mn, Nb, La or the like. A-site or B-site metal dopants are introduced to replace a corresponding amount, or an isoelectric amount, of up to 2 at. % of the respective A-site and B-site metals of $PbTiO_3$, $SrTiO_3$, $BiFeO_3$, $(K_xBi_{1-x})TiO_3$. Exemplary metal dopants are Ti, Zr, W, Nb, V, Ta, Mo and Mn. In preferred embodiments where a dopant is present the dopant is selected from Nb or Mn.

In a further aspect, the invention provides a ceramic that comprises a quaternary solid solution as described above and herein obtainable by a process comprising the steps (A) preparing an intimate mixture of a substantially stoichiometric amount of a compound of each of Bi, K, Ti, Fe, Pb, Sr and, optionally, a dopant; (B) converting the intimate mixture into an intimate powder; (C) inducing a reaction in the intimate powder to produce a mixed metal oxide; (D)

manipulating the mixed metal oxide into a sinterable form; and (E) sintering the sinterable form of the mixed oxide to produce the ceramic. In this aspect, the process may further comprise a hot pressing step.

In a further aspect, the invention provides a process for preparing a ceramic comprising a quaternary composition as described above and herein comprising the steps: (A) preparing an intimate mixture of a substantially stoichiometric amount of a compound of each of Bi, K, Ti, Fe, Pb and Sr; (B) converting the intimate mixture into an intimate powder; (C) inducing a reaction in the intimate powder to produce a mixed metal oxide; (D) manipulating the mixed metal oxide into a sinterable form; and (E) sintering the sinterable form of the mixed oxide to produce the ceramic, optionally comprising a hot pressing step.

In a further aspect, the invention provides a piezoelectric device, for example an actuator, comprising a piezoelectric ceramic composition described above and herein.

In a further aspect, the invention provides a droplet deposition head, for example an inkjet printhead, comprising an actuator as described herein formed from a material as described above and herein.

The piezoelectric coefficients $d_{33}$ exhibited by the materials of the invention are characteristically higher than those exhibited by the ternary, strontium free, compositions described in WO2012/013956 A1, and are typically 30% higher, often 50% higher or more, than the $d_{33}$ piezoelectric coefficients exhibited by the corresponding strontium free ternary materials.

The combination of properties possessed by the new quaternary compositions renders them particularly suitable for application in devices that are operated or fabricated at high temperatures. For example, atomic layer deposition can be used to introduce passivation layers onto these piezoelectric materials at temperatures under which materials of the art would partially or fully depole. In addition, the combination of high strength and high coercive field and coercive stress renders these materials suitable for use in fabrication of devices featuring thin wall or other feature architectures as the resultant thin wall or other features can be driven under high field conditions and can resist fracture that would otherwise lead to mechanical failure.

Preferably the ceramic consists essentially of the solid solution. For example, the solid solution may be present in the ceramic in an amount of 50 wt % or more (e.g. in the range 50 to 99 wt % or more), preferably 75 wt % or more, particularly preferably 90 wt % or more, more preferably 95 wt % or more.

Non-perovskite phases may be mixed metal phases of two or more (e.g. three) of Bi, K, Ti, Fe or Pb. Examples include $Bi_2O_3$, $K_2O$, SrO, $Bi_2Fe_4O_9$ and $Bi_3Ti_4Oi_{12}$.

The amount of non-perovskite phases present in the ceramic may be such that the phases are non-discernible in an X-ray diffraction pattern. The amount of non-perovskite phases present in the ceramic may be a trace amount.

Preferably the total amount of non-perovskite phases present in the ceramic is less than 10 wt %, particularly preferably less than 8 wt %, more preferably less than 5 wt %, yet more preferably less than 2 wt %, still yet more preferably less than 1 wt %, most preferably less than 0.1 wt %.

The solid solution may be a partial solid solution. Preferably the solid solution is a complete solid solution.

The solid solution may be substantially monophasic.

The solid solution may be biphasic. Preferably the solid solution has at least two phases selected from the group consisting of a rhombohedral phase, a monoclinic phase, an orthorhombic phase and a tetragonal phase. The solid solution may comprise a rhombohedral phase and a monoclinic phase. The solid solution may comprise a rhombohedral phase and orthorhombic phase. Preferably the solid solution comprises a tetragonal phase and a rhombohedral phase.

The solid solution may be triphasic or may have more than three crystal phases.

The components of the solid ceramic may be varied within the general formula to tailor the properties of the material such as the Curie temperature, the piezoelectric activity, the coercive field, the coercive stress and the strength to the required value for the application.

Preferably c is greater or equal to 0.3 and less than or equal to 0.7 and/or d is greater than or equal to 0.05 and less than or equal to 0.25. For example, a preferred ceramic according to the general formula $(a[PbTiO_3]$-$b[SrTiO_3]$-$c[BiFeO_3]$-$d[(K_xBi_{1-x})TiO_3])$ has the parameters $0.1 \leq a \leq 0.4$; $0.01 \leq b \leq 0.2$; $0.3 \leq c \leq 0.7$; $0.05 \leq d \leq 0.25$; and $a+b+c+d=1$. Preferably c is from 0.4 to 0.6, particularly preferably from 0.46 to 0.58. Compositions in which c, i.e. the amount of $BiFeO_3$, is greater or equal to 0.3, generally exhibit improved strength and in turn these compositions have an improved resistance to failure in manufacture and/or operation, allow adoption of sawing to produce thin structures, such as the walls of a fluidic chamber in a droplet deposition head and provide for improved device lifetimes. If the value of c, i.e. the amount of $BiFeO_3$, is greater than 0.7 then the piezoelectric activity of the material tends to reduce, i.e. the materials generally have a lower piezoelectric coefficient $d_{33}$. As will be appreciated, individual ceramic compositions can be tailored to meet the desired application and in some cases a higher strength and a higher Curie temperature will be more important than ultimate piezoelectric activity while in other cases a high strength and a high piezoelectric activity will be favoured over a maximum Curie temperature value.

Preferably d is greater or equal to 0.05 and less than or equal to 0.25. A value of d, i.e. the amount of $[(K_xBi_{1-x})TiO_3]$, in this range favours a good combination of strength and piezoelectric properties. In some cases it is preferred that the value of x is 0.5, i.e. $[(K_xBi_{1-x})TiO_3]$ is $[(K_{0.5}Bi_{10.5})TiO_3]$. In particularly preferred cases d is in the range of from 0.08 to 0.21, for example 0.1475+/−0.05, 0.16+/−0.05 or 0.13+/−0.05. Materials in which d is from 0.08 to 0.21 have proven to have a particularly desirable combination of properties, e.g. strength, piezoelectric properties and Curie temperature for the fabrication of actuators.

Preferably a is greater or equal to 0.2 and less than or equal to 0.3. A value of a, i.e. the amount of $PbTiO_3$, of 0.2 or more is preferred as this amount of $PbTiO_3$ in the solid solution provides an improvement in the long-range order in the ceramic and ensures good ferroelectric properties, for example improved piezoelectric activity as evidenced through the piezoelectric coefficients (e.g. $d_{33}$ and $d_{15}$), improved linearity between electric field and strain and improved temperature stability. A value of a, i.e. the amount of $PbTiO_3$, of 0.3 or more serves to increase the spontaneous strain and thus further improves the coercive field but this is at a cost of reduced piezoelectric activity—as reflected by reduced piezoelectric coefficients (e.g. $d_{33}$ and $d_{15}$). A value of a above 0.3 also renders poling of the piezoelectric material more difficult. In preferred cases a is from 0.22 to 0.28, most preferably 0.24 to 0.26, for example 0.25625.

Preferably b is greater than or equal to 0.02 and less than or equal to 0.15. A value of b, i.e. a content of $SrTiO_3$, of greater than 0.15 and in particular 0.2 delivers a material with a reduced Curie temperature while a value of b less than 0.01 and in particular, 0.02 delivers a material with a lower piezoelectric activity. In preferred cases b is from 0.25 to 0.125, most preferably 0.05 to 0.10, for example 0.05, 0.06, 0.07, 0.08, 0.09 or 0.10.

For example, a preferred ceramic according to the general formula has a composition with $0.2 \leq a \leq 0.3$; $0.02 \leq b \leq 0.15$; $0.3 \leq c \leq 0.7$; $0.05 \leq d \leq 0.25$; and $a+b+c+d=1$. The compositions within this range advantageously exhibit a favourable combination of high Curie temperature, good piezoelectric activity, high strength and high coercive field. Preferred compositions have a formula with i) $0.2 \leq a \leq 0.3$; $0.025 \leq b \leq 0.125$; $0.4 \leq c \leq 0.6$; $0.05 \leq d \leq 0.25$; and $a+b+c+d=1$, ii) $0.23 \leq a \leq 0.27$; $0.025 \leq b \leq 0.10$; $0.45 \leq c \leq 0.6$; $0.05 \leq d \leq 0.25$; and $a+b+c+d=1$ or iii) $0.24 \leq a \leq 0.26$; $0.05 \leq b \leq 0.10$; $0.46 \leq c \leq 0.58$; $0.08 \leq d \leq 0.21$; and $a+b+c+d=1$.

Examples of compositions that fall within these preferred ranges are described herein, as are their advantageous properties. As can be seen below if the value of a is set at 0.25625 and the value of b is set at 0.075 (parameters a 0.25625, b 0.075, c=0.52125, d=0.1475) then a material with excellent combination of strength, piezoelectric activity and Curie temperature is obtained. Keeping the value of a constant, if a higher piezoelectric activity, as seen by e.g. piezoelectric coefficient $d_{15}$ value, is desired, this can be achieved by increasing the amount of $SrTiO_3$ to 0.10. Adjustments in the values of c and d can be then made to fine tune the material properties. It is thus possible to realise a material with further improved piezoelectric activity that substantially retains the other favourable properties of the ceramic (parameters a 0.25625, b 0.10, c, 0.5096, d 0.13415). If, relative to the 0.075 $SrTiO_3$ ceramic above, a slightly higher Curie temperature is required then the amount of $SrTiO_3$ can be reduced to 0.05 to give a ceramic (parameters a 0.25625, b 0.05, c, 0.5329, d 0.16085) with a higher temperature withstand that also has good strength and piezoelectric activity. The present invention provides a range of compositions in which the skilled person can work to obtain a ceramic with the properties for the desired application.

The invention also provides a ceramic comprising a solid solution, substantially free of non-perovskite phases, of the formula

wherein $0.4 \leq x \leq 0.6$; $0.1 \leq a \leq 0.4$; $0.01 \leq b \leq 0.2$; $c \geq 0.05$; $d \geq 0.01$; and $a+b+c+d=1$, in which one or more of A-site and B-site atoms may be substituted by up to 2 at. % of a dopant.

In preferred embodiments, one or more of Fe and Ti may be substituted by up to 2 at % of a dopant selected from Ti, Zr, W, Nb, V, Ta, Mo and Mn. Individual perovskite phases generally tolerate a degree of doping without compromising the perovskite structure of the resultant doped phase.

In the compositions of the present invention the doping of the perovskites can be at the metal B-sites, i.e. the Ti site of $PbTiO_3$, $SrTiO_3$ and $(K_xBi_{1-x})TiO_3$ and the Fe site of $BiFeO_3$. In these cases the amount of metal dopant is up to 2 at. % per metal B-site. A proportion of up to 2 at. % of the B-site metal in each component of the composition can, for example, be replaced with a dopant such as Mn or Nb. When the dopant is Mn or Nb, Mn or Nb is present in an amount of up to and including 2 at. % per metal site, although preferably the level of dopant is from 0.25 at. % to 1 at. %. Dopant metals can be incorporated in an amount equal to the amount of A- or B-site metal removed or in an isoelectric amount. For example, a doped composition according to the invention wherein the B-site of $BiFeO_3$ is doped with Mn (in the 4+ oxidation state) could be expressed as

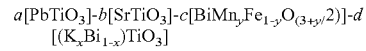

wherein $y \leq 0.02$; $0.4 \leq x \leq 0.6$; $0.1 \leq a \leq 0.4$; $0.01 \leq b \leq 0.2$; $c \geq 0.05$; $d \geq 0.01$; and $a+b+c+d=1$. The preferred compositions for doping are those described above. Thus, in a preferred composition wherein 1 at. % of Mn is added in place of Fe at the B-site of $BiFeO_3$, the composition would have the following parameters, y=0.01; $0.4 \leq x \leq 0.6$; $0.24 \leq a \leq 0.26$; $0.05 \leq b \leq 0.10$; $0.46 \leq c \leq 0.58$; $0.08 \leq d \leq 0.21$; and $a+b+c+d=1$.

In a particularly preferred embodiment, the B-site metal dopant is Mn. An advantage of Mn incorporation in this amount is that the Mn can behave as a buffer in the sense that it can adopt a range of oxidation states and this can in turn improve resistivity of the ceramics relative to the Mn free material.

In a particularly preferred embodiment, the B-site metal dopant is Nb and can be used to substitute at the Fe site, the Ti site or both the Fe site and the Ti site. The amount of Nb that is used to substitute at the Fe site, the Ti site or at both of the Ti and the Nb site can be up to a total of 2 at. % per metal site and preferably up to 1 at. % per metal site.

The ceramic may take the form of a textured ceramic, a single crystal, a thin film or a composite (e.g. a ceramic/glass or ceramic/polymer composite).

Preferably the Curie temperature of the ceramic is 300° C. or more, for example 320° C. or more, 340° C. or more, preferably 350° C. or more, and most preferably 400° C. or more.

The ceramic may be obtainable by sintering a sinterable form of a mixed metal oxide containing Bi, K, Fe, Sr, Pb, Ti and optionally a dopant to produce the ceramic.

Working within the ranges specified above, new piezoelectric ceramics with a combination of desirable material properties can be achieved. Preferred examples of the ceramic of the invention have a piezoelectric coefficient, $d_{33} \leq 250$ pm/V and a $d_{15} \leq 400$ pm/V, which although lower than, for example, that of PZT-5H is compensated for by a higher coercive field. For example, as can be seen below, materials with a coercive field of 2.2 kV/mm (cf. PZT-5H 0.87 kV/mm from IEEE Ultrasonics Symposium, 2005 (Volume:1) p 227-230, ISBN 0-7803-9382-1) and a high field $d_{33}$ of 431 pm/V at 4.0 kV/mm. The coercive field is defined as the field at which the atoms in the unit cell resume their centrosymmetric positions, and is indicated on a polarisation-field loop as the point at which the polarisation is equal to zero.

For PZTs, fracture is a common failure mode, certainly for PZT-based actuators. PZTs typically have a fracture toughness parameter ($K_{1C}$) of the order of 0.7 to $1.8 \times 10^6$ MPa×$m^{1/2}$ (Sun and Park, Ferroelectrics, vol. 248, no. 1, pp. 79-95, 2000). The materials according to the invention typically have a $K_{1C}$ value from 4 to $8 \times 10^6$ MPa×$m^{1/2}$ i.e. they have a fracture toughness 2- to 10-fold higher than PZTs. In conventional PZTs, attempts to improve fracture toughness by adding a secondary non-piezoelectric phase are associated with only incremental improvement in strength and are accompanied by a substantially reduced piezoelectric activity.

The quaternary compositions described herein are also characteristically harder than PZTs with a Vickers hardness (in kgf/mm²) ca. 1.5 to 2-fold greater than PZTs. The toughness and hardness of the quaternary compositions described herein allow the possibility to deliver materials with superior strength. Devices with thinner features than conventional devices can be produced with such materials.

Perovskites have the general structure $ABO_3$ wherein A and B are metals that occupy the A- and B-sites, respectively. In some preferred compositions of the present invention doping of the perovskites is confined to the metal B-sites, i.e. the Ti site of $PbTiO_3$, $SrTiO_3$ and $(K_xBi_{1-x})TiO_3$ and the Fe site of $BiFeO_3$. In these preferred compositions, the amount of metal dopant per metal B-site is up to 2 at. % per metal B-site.

Although perovskite solid solutions are generally tolerant to substitution with additional perovskites, and this has proven to be the case for the compositions described herein, this cannot be taken for granted. Accordingly, until the present work it could not have been known whether the quaternary compositions of the inventions would form a ceramic solid solution, nor if formed, what the properties of such solutions would be. For example, the binary high temperature piezoelectric $zBiScO_3$—$(1-z)PbTiO_3$ is not soluble for all values of z. In addition, it is known in the art that other competing non-perovskite materials can form, for example bismuth titanate ($Bi_4Ti_3O_{12}$) could form. Other secondary phases can form from perovskites, notably pyrochlore type phases. To illustrate this potentially important issue, it is known in the art that pure $BiFeO_3$ is extremely difficult to form, and $Bi_2Fe_4O_9$ can readily form with a non-perovskite structure. The formation of such secondary phases can lead, amongst other effects, to a significant drop in piezoelectric performance and a reduction in strength.

The present disclosure is also concerned with a droplet deposition apparatus including the droplet deposition head produced with the materials described above, as well as a method for the manufacture of the droplet deposition head and the droplet deposition apparatus.

A variety of alternative fluids may be deposited by a droplet deposition head. For instance, a droplet deposition head may eject droplets of ink that may travel to a sheet of paper or card, or to other receiving media, such as ceramic tiling or shaped articles (e.g. cans, bottles etc.), to form an image, as is the case in inkjet printing applications (where the droplet deposition head may be an inkjet printhead or, more particularly, a drop-on-demand inkjet printhead).

Alternatively, droplets of fluid may be used to build structures, for example electrically active fluids may be deposited onto receiving media such as a circuit board so as to enable prototyping of electrical devices.

In another example, polymer containing fluids or molten polymer may be deposited in successive layers so as to produce a prototype model of an object (as in 3D printing).

In still other applications, droplet deposition heads might be adapted to deposit droplets of solution containing biological or chemical material onto a receiving medium such as a microarray.

Droplet deposition heads suitable for such alternative fluids may be generally similar in construction to printheads, with some adaptations made to handle the specific fluid in question.

High temperature applications of droplet deposition heads, that are achievable only if a high Curie temperature piezoelectric material, as those described in the present invention, is used to produce the actuator, include, for example, the deposition of hotmelts, for example standard wax and hybrid-wax, i.e. UV curable hotmelts, high viscosity UV-resists and the like, for applications as, for example, etch masks; Braille printing; spacers for thin display technologies; high resolution, high opacity prints on transparent substrates for projection applications; higher resolution removable marking in production processes; 3D printing; paper micro-fluidics, where the wax is reflown into the paper structure to create fluidic channels for low-cost diagnostics, and the like. These materials typically need to be held at 60-140° C. in order to achieve a viscosity suitable for jetting.

Droplet deposition heads as described in the following disclosure may be drop-on-demand droplet deposition heads. In such heads, the pattern of droplets ejected varies in dependence upon the input data provided to the head.

Drop-on-demand head actuators comprise actuator elements that are configured to act upon individual fluid chambers to effect droplet ejection. The actuator element may be a thermal or a piezoelectric element, for example. In each case the actuator material is addressed by electrodes to cause either rapid heating of a resistor-type actuator element in the case of a thermal actuator element, or mechanical deformation in the case of piezoelectric actuator elements.

Different configurations of piezoelectric actuator elements may be used. One configuration uses actuator elements formed from a continuous sheet of piezoelectric material into which parallel grooves are sawn to form longitudinal fluid chambers.

One such configuration, providing a "side shooter" droplet deposition head is described in EP 0 364 136 B1, and references therein, and shown in FIG. 1.

The droplet deposition head (FIG. 1) includes a plurality of fluid chambers 110 arranged side-by-side in an array. This array extends from left to right in FIG. 1. Each of the fluid chambers 110 is elongate in a chamber length direction, and perpendicular to the array direction. Adjacent chambers 110 are separated by chamber walls 130, which are formed of piezoelectric material. Each of the fluid chambers 110 are provided with a nozzle 172, from which fluid contained within the fluid chamber 110 may be ejected. One longitudinal side of each of the fluid chambers 110 is bounded (at least in part) by a nozzle plate 170, which provides a nozzle 172 for each of the chambers 110. It will be appreciated that other approaches may achieve this as well: a separate nozzle plate 170 component is not required in order that each nozzle 172 is provided in one longitudinal side of the corresponding one of the firing chambers 110.

Each wall 130 is provided with a first electrode 151 and a second electrode 152 on opposite side surfaces. Appropriate electrode materials may include copper, nickel and gold, either used alone or in combination. The deposition may be carried out by an electroplating process, electroless processes (for example utilising palladium catalyst to provide the layer with integrity and to improve adhesion to the piezoelectric material), or by physical vapour deposition processes.

The first 151 and second 152 electrodes are configured to apply a drive voltage waveform to the wall 130. Each wall 130 includes a first portion 131 and a second portion 132, with the respective piezoelectric material being poled in opposite direction to each other. The poling direction of each of the first portion 131 and the second portion 132 is perpendicular to the array direction and to the chamber length direction. The first 131 and second 132 portions are separated by a plane defined by the array direction and the chamber length direction.

When a drive voltage waveform is applied to the wall 130 by the first 151 and second 152 electrodes, the wall 130 deforms in a chevron configuration, whereby the first 131 and second 132 portions deform in shear mode in opposite senses, as is shown in dashed-line in FIG. 1.

Such deformation causes an increase in the pressure of the fluid within that one of the two fluid chambers 110 and a corresponding reduction in the pressure of the other one of the two fluid chambers 110. It will be appreciated that a drive waveform of opposite polarity will cause the wall 130 to deform in the opposite direction, thus having substantially the opposite effect on the pressure of the fluid within the two chambers 110 separated by the wall 130. Where the magnitude of the pressure exceeds a certain level, droplets of fluid 105 may be ejected from the nozzle 172 of a chamber 110. The wall 130 may be driven such that it deforms alternately toward one of the two fluid chambers 110 it separates and toward the other. It will be appreciated that such cyclical deformation is by no means essential: the drive waveform could instead cause non-cyclical deformations of the wall.

It should of course be appreciated that deformation in chevron configuration may be achieved with different arrangements of the wall 130 and the first 151 and second 152 actuation electrodes. For example, the piezoelectric material of the wall may be poled substantially in only one direction, a wall height direction. The first 151 and second 152 electrodes may be arranged such that they extend over only a portion of the height of the wall 130 in this height direction (more particularly, they may extend over substantially the same portion of the height of the wall 130 in this height direction).

Another such configuration, providing an "end shooter" droplet deposition head is described in EP 1 885 561 B1, and references therein, and shown in FIG. 2. In this arrangement, each nozzle 272 is provided at the longitudinal end of a firing chamber 210, for droplet ejection. Walls 230 may be actuated to cause droplet ejection by a first electrode 251 and a second electrode 252 as described above.

As a result of the high toughness of the materials described in the present disclosure, the piezoelectric sheets can be machined so as to obtain thinner walls 130 and 230 (for example 20 to 60 μm) so that the actuator resolution can be increased, without causing fractures in the walls.

Due to the high coercive field of the materials described in the present applications, thinner walls can be driven at higher electric field without degradation in performance with respect to the actuators with thicker walls which require lower drive fields.

The metal electrodes in these droplet deposition heads are in direct contact with fluids and so are susceptible to electrolysis and bubble formation or corrosion. This can lead to delamination of the electrodes and/or short operational lifetime for the droplet deposition head especially if the fluid is aqueous.

A passivation coating is, therefore, usually provided on the electrodes and on the surfaces of the piezoceramic body in contact with the fluid, in particular, on the chamber walls of each chamber. One of the methods known in the art to deposit passivation layers on electrodes is atomic layer deposition (ALD). ALD passivation layers are very suitable for electrode passivation for droplet deposition head applications as they are thin enough not to significantly affect chamber volume and nozzle size. A reliable and thin passivation layer also enables the actuator in a droplet deposition head to be aqueous compatible. Low Curie temperature materials depole at temperatures below those, for example 200° C. or higher, at which high quality, dense, passivation layers can be formed with ALD. PZT, for example, can start depoling at 120° C. High Curie temperature materials, as those described in the present application are therefore desirable in order to get a reliable passivation on the electrodes thus making the actuator compatible with aqueous and other ionic fluids. Useful passivation materials that can be deposited through ALD are alumina, titania, hafnia or the like and typical thickness values are, for example, in the range 10-100 nm.

As a further improvement, the actuators produced with the materials can be operated at significantly elevated temperatures without significant degradation. This material property allows access to actuator structures that are compatible with droplet deposition processes for materials requiring high temperature to get a fluid consistency that allows jetting. These may comprise hotmelts, for example standard wax and hybrid-wax, i.e. a UV curable hotmelts, high viscosity UV-resist and the like, for applications as, for example, etch masks; Braille printing; spacers for thin display technologies; high resolution, high opacity substrates for projection applications; higher resolution removable marking in production processes; 3D printing; paper micro-fluidics, where the wax is reflown into the paper structure to create fluidic channels for low-cost diagnostics, and the like. These materials typically need to be held at 60-140° C. in order to achieve a viscosity suitable for jetting.

In some embodiments, one of which is shown in FIG. 3, the actuator includes firing chambers 310, from which fluid may be ejected through the nozzles 372, as well as non-firing chambers 320, which are configured such that they are unable to eject droplets. Firing chambers and non-firing chambers are typically alternate, and the non-firing chambers do not contain ink or a nozzle. Instead they contain the drive electrodes 351 and 354 which in this way are physically isolated from contact with the ink. This type of configuration offers several advantages. For example, this configuration can be used in order to allow aqueous inks to be jetted by placing the drive electrodes in the non-firing chamber. Since electrodes with different potentials are not in contact with the fluid the risk of failure caused by the presence of ionic species in the fluid is removed and the electrodes do not need any passivation. It may also be used to reduce the mechanical crosstalk. However, the disadvantage is the loss of resolution by doubling the distance between adjacent nozzles. The limitation is the machinability of the piezoelectric material to create thinner walls while keeping the firing chamber dimensions the same to retain acoustic actuation properties. Actuators including alternate firing and non-firing chambers can therefore particularly benefit from being produced with the materials herein described in order to increase their resolution, since the materials allow machining of thinner walls to recover some of the resolution lost in a device made from conventional PZTs.

In some further embodiments, one of which is shown in FIG. 4, a droplet deposition head is characterised as being operated in "roof mode".

Multiple fluid chambers 610 are provided side-by-side in an array. Each fluid chamber is provided with a nozzle 672 formed in a nozzle layer 670, from which fluid contained within the chamber 610 may be ejected, in a manner that will be described below. Each of the fluid chambers 610 is elongate in a chamber length direction, which is into the page in FIG. 4. On an opposing side of each chamber 610 to the nozzle layer 670, there is provided a vibration plate 660. The vibration plate 660 is deformable to generate pressure fluctuations in the fluid chamber 610, such that fluid may be ejected from the fluid chamber 610 via the nozzle 672. The vibration plate 660 may comprise any suitable material, such as, for example a metal, an alloy, a dielectric material and/or a semiconductor material. Examples of suitable materials include stainless steel, silicon nitride ($Si_3N_4$), silicon dioxide ($SiO_2$), aluminium oxide ($Al_2O_3$), titanium dioxide ($TiO_2$), silicon (Si) or silicon carbide (SiC). The vibration plate 660 may additionally or alternatively comprise multiple layers.

The droplet deposition head further includes a multiplicity of piezoelectric actuating elements 630 provided on the vibration plate 660. A respective piezoelectric actuating element 630 is provided for each fluid chamber 610, with the piezoelectric actuating element 630 configured to deform the vibration plate 660. The piezoelectric actuating element 630 may comprise the ceramic according to the present invention.

Each piezoelectric actuating element 630 is provided with a first actuation electrode 651 and a second actuation electrode 652. The second actuation electrode 652 is provided on one side of the piezoelectric actuating element 630, between the piezoelectric actuating element 630 and the vibration plate 660. The first actuation electrode 651 is provided on the opposing side of the piezoelectric actuating element 630.

The first and second actuation electrodes 651, 652 may comprise any suitable material. The first and second actuation electrodes 651, 652 may be formed using any suitable technique.

The first and second actuation electrodes 651, 652 and the piezoelectric actuating element 630 may be patterned separately or in the same processing step.

The piezoelectric material forming the piezoelectric actuating element 630 is poled in the same direction as the applied electric field, so that the actuating element 630 is operated in transverse mode. When a drive waveform is applied by the first and second actuation electrodes 651, 652 to the piezoelectric actuating element 630, a stress is generated in the piezoelectric actuating element 630, causing it to deform on the vibration plate 660. This deformation changes the volume within the fluidic chamber 610 and fluid droplets may be discharged from the nozzle 672. Selected piezoelectric actuating elements 630 may be driven with an appropriate drive waveform. This selection may vary in dependence upon the input data received by the droplet deposition head.

A wiring layer (not shown) comprising electrical connections may also be provided on the vibration plate 660, whereby the wiring layer may comprise two or more electrical tracks for example, to connect the first and second actuation electrodes 651, 652 to voltage signals, or to ground.

As may be seen from FIG. 4, adjacent firing chambers 610 are separated by walls 640 which can be a piezoelectric material or other suitable material.

The present invention is also concerned with other devices comprising a ceramic comprising the materials hereinbefore described.

The enhanced strength of the materials of the invention provides advantage in actuators, plus sensors, transducers and energy harvesting, where the strength of the material is paramount.

It should be noted that the foregoing description is intended to provide non-limiting examples that assist the skilled reader in understanding an aspect of the present invention and that demonstrate how the present invention may be implemented. Other examples and variations are contemplated within the scope of the appended claims.

The ceramics of the invention are prepared by any suitable method. Suitable methods that may be used include, but are not limited to, hot pressing, hot isostatic pressing, physical vapour deposition (PVD), such as pulsed lased deposition (PLD), and chemical solution deposition (CSD), such as the sol-gel method. In an aspect of the invention there is provided a method for manufacturing a quaternary composition as described above that comprises the steps of a) weighing of Bi, Fe, Pb and Ti oxides and K and Sr carbonates according to the desired stoichiometry b) a first homogenization and particle size reduction step in which the powders are reduced to a $d_{50}$<1.5 µm; c) calcination of the powder to deliver a single or multiple phase perovskite material substantially free of additional secondary non-perovskite phases; d) a second homogenization and particle size reduction step to deliver a powder with a $d_{50}$<1.5 µm; e) sintering to produce ceramic of average grain size of between 1.0 µm and 6.0 µm, in particular, between 1.0 µm and 4.0 µm or 1.0 µm and 3.0 µm, for example, 1.4 µm.

Note that an average grain size of between 1.0 µm and 6.0 µm is intended to provide a high value of $d_{33}$ (it being known in PZT ceramics that a minimum grain size of 1-2 µm is required for a high value of $d_{33}$) and to enable 30 µm pressure chamber walls for inkjet printheads (a minimum of 5 grains being required to span linearly across the thickness of each wall to mitigate failure from grain pull out and trans-granular fracture).

The calcining step is preferably performed at a temperature from 700° C. to 900° C., optionally for from 2 to 8 hours. Particle size reduction steps are optionally performed by bead milling or ball milling. In some preferred cases the pre-sintering particle size is further reduced to a $d_{50}$<0.7 µm, optionally with an attrition mill. The process may also comprise the step of spray drying—prior to sintering. In addition, it is preferred to press the sample prior to sintering. Sintering of the material is preferably performed at a temperature of from 980° C. and 1080° C. for between 2 and 128 hours. In some preferred cases the method also comprises the step of poling the material at 100° C. at 5 kV/mm.

It is preferred that the X-ray diffraction of a poled pellet, produced by the method above, exhibits a mixed phase rhombohedral-tetragonal material substantially free of additional secondary phases.

The invention also relates to a ceramic of the compositions of the invention obtainable by the processes described above.

In order that the invention may be fully understood, it is now described having regard to the following Examples and the accompanying drawings. It will be appreciated, however, that the Examples as well as the description do not necessarily limit the scope of the invention.

EXAMPLES

The Examples relate to ceramics produced by the addition of amounts of $SrTiO_3$ to a ternary composition of 0.256 [$PbTiO_3$], 0.521[$BiFeO_3$] and 0.188($K_{0.5}Bi_{0.5}$)$TiO_3$—hereinafter composition X.

Composition X is an example of a ternary composition having a set amount of $PbTiO_3$ and amounts of $BiFeO_3$ and ($K_{0.5}Bi_{0.5}$)$TiO_3$ which are optimised to lie in the morphotropic phase boundary region—viz., the region that displays the highest piezoelectric activity for the compositional range.

The Examples show that substitution in this ternary composition with $SrTiO_3$ results in quaternary compositions that form a ceramic solid solution having very desirable properties such as exceptional toughness.

Preparation of Ceramics According to the Invention

The moisture content and loss on ignition of the precursor materials was performed and adjustments to obtain the desired compositions were made according to the moisture and loss on ignition results.

$Bi_2O_3$, $Fe_2O_3$, $K_2CO_3$, $Pb_3O_4$, $SrCO_3$ and $TiO_2$ were weighed out according to the stoichiometry required for the specific composition and combined. The resultant powder was then blended prior to particle size reduction to a mean particle diameter $d_{50}$<1.5 µm using a pin mill. The resultant powder was calcined between 700° C. and 900° C. for between 2 and 16 hours. A second particle size reduction to a $d_{50}$ of <1.5 µm was then performed.

Further homogenization and particle size reduction, to 0.2 µm<$d_{50}$<0.8 µm, was then carried out using an attrition mill. Addition of a binder-softener system (Zusoplast G63 and Optapix AC112 both from Zschimmer & Schwarze GmbH & Co KG) was required prior to spray drying of the resultant slurry.

The ceramic materials were produced by uni-axially pressing of the powder, then subsequent isostatic pressing between 25 and 100 MPa and subsequent iso-pressing of the samples between 50 MPa and 200 MPa. Burn-out of the binder from the samples was carried out up to 600 C prior to sintering. Sintering of the samples between 980° C. and 1080° C. for between 2 and 128 hours was performed to deliver a ceramic material with a final grain size between 1.5 µm and 6 µm.

The ceramic materials were prepared for testing of piezoelectric and other properties by grinding and cutting to form pellets (diameter 10 mm and thickness 1 mm) or bars (of dimensions 25 mm×3 mm×0.5 mm). Electrodes were formed where necessary by applying silver termination ink (Gwent Electronic Materials silver termination paste) to opposite faces of the pellets or bars and then firing according to the manufacturer's recommendations. Where necessary, poling was carried out at 100° C. at 5 kV/mm.

Figure 1:
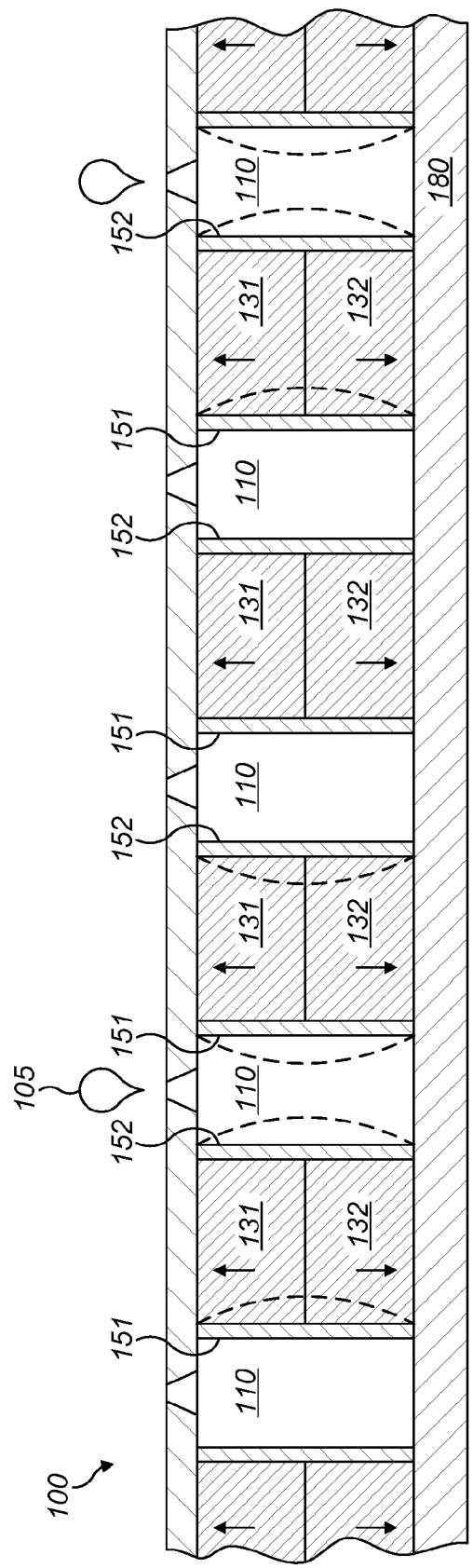
FIG. 1 shows a cross section of a "side shooter" droplet deposition head as described in EP 0 364 136 B1.
Figure 2:
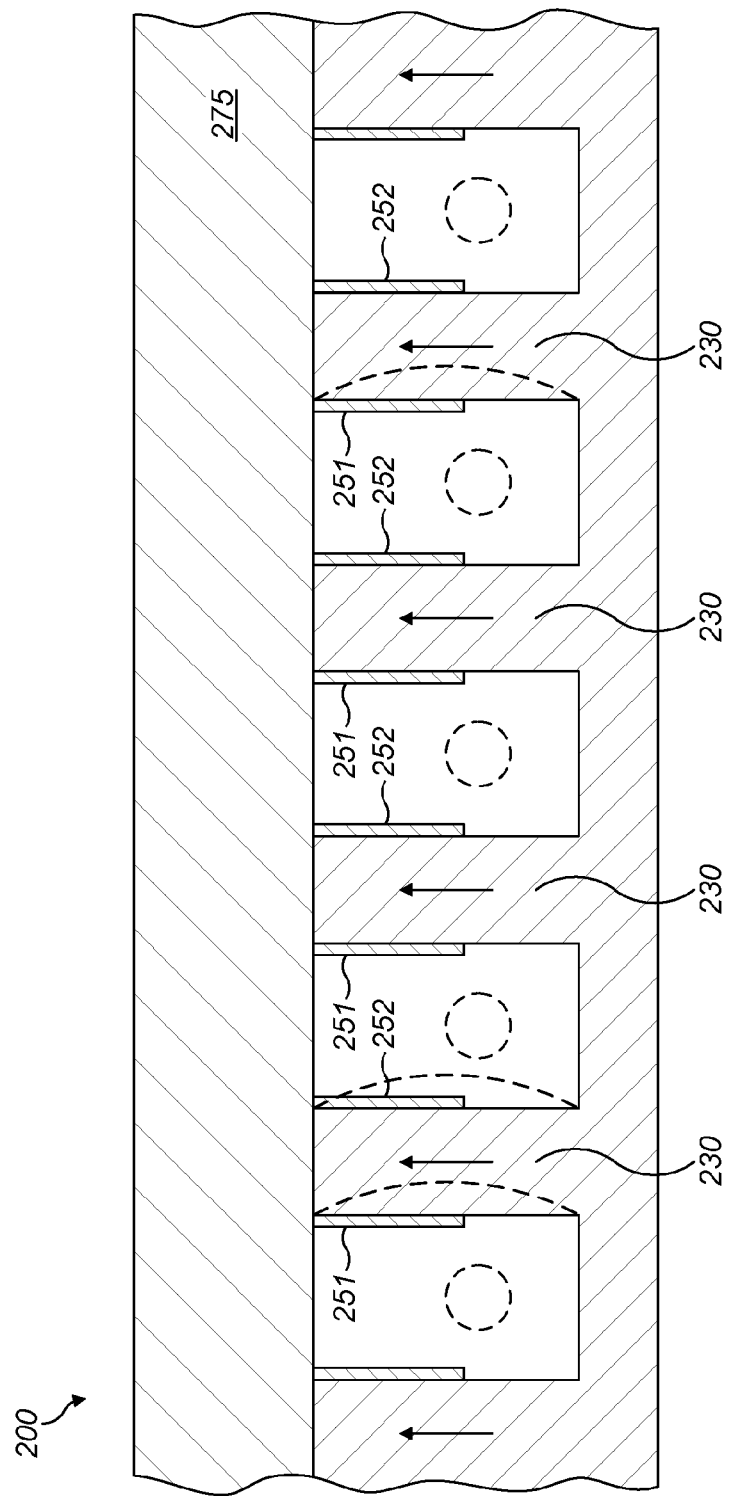
FIG. 2 shows a cross section of an "end shooter" droplet deposition head as described in EP 1 885 561 B1.
Figure 3:
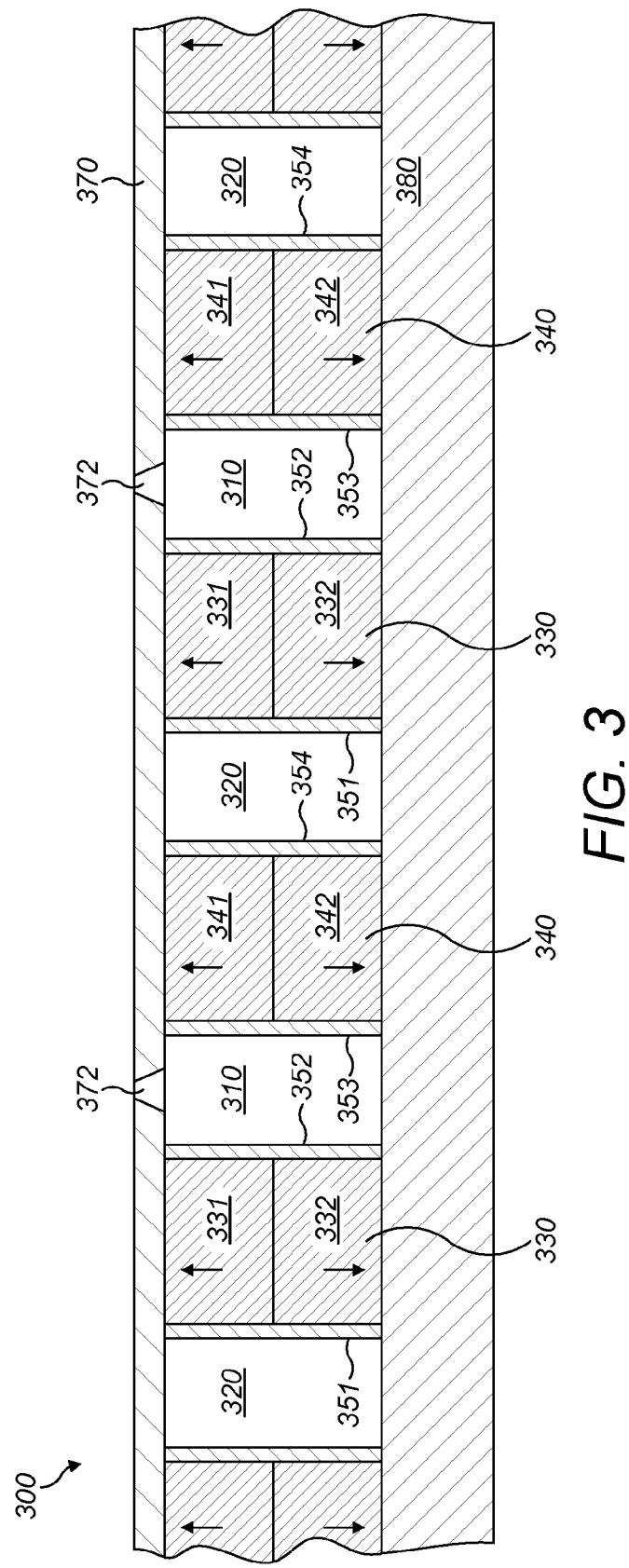
FIG. 3 shows a cross section of a "side shooter" droplet deposition head with firing and non-firing fluidic chambers.
Figure 4:
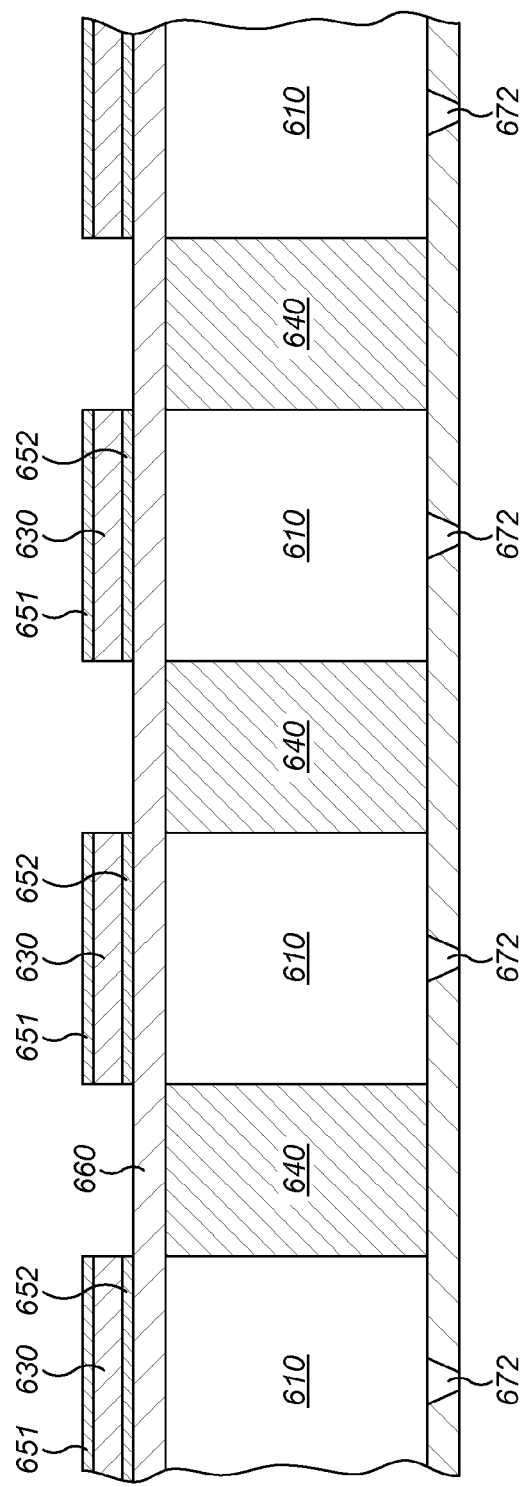
FIG. 4 shows a cross section of a "roof mode" droplet deposition head.
Figure 5:
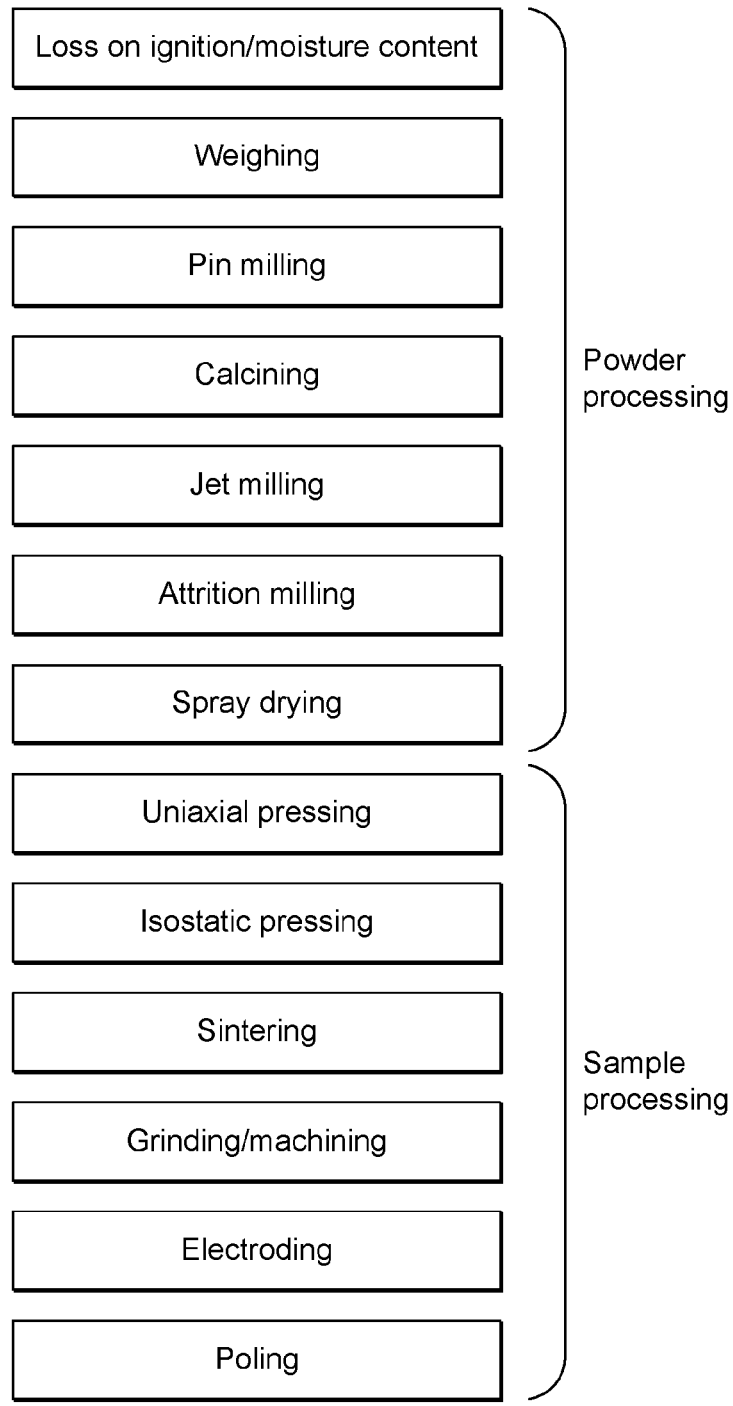
FIG. 5 is a flow chart of a ceramic production method according to an embodiment of the present invention.

The steps of the process are shown schematically in FIG. 5 and can be considered to comprise a series of initial powder processing steps and a final series of sample processing steps.

Properties of a Ceramic According to the Present Invention

An exemplary material according to the present invention was developed from and compared to X.

Ceramic materials of quaternary composition are obtained as described above by substituting amounts of $SrTiO_3$ in place of the corresponding amount of $BiFeO_3$.

Samples were prepared for testing of the piezoelectric properties of the ceramic as follows: after sintering, the ceramic parts were ground and formed into pellets of diameter 10+/−0.5 mm and thickness 1+/−0.1 mm. Electrodes were prepared by screen printing a silver electrode frit (Gwent Electronic Materials silver termination paste) and firing on according to the manufacturer's recommendations.

The piezoelectric activity ($d_{33}$), Curie temperature ($T_c$) and relative electric permittivity $\varepsilon_r$ were determined as described in detail below for four samples comprising quaternary compositions containing different amounts of $SrTiO_3$. A powder X-ray diffraction pattern of the crystalline structure of each of the quaternary compositions was also obtained.

The Berlincourt $d_{33}$ value and the relative electrical permittivity at room temperature (RT) and at the Curie temperature ($T_c$) are shown for each sample in Table 1.

As can be seen, increasing the amount of $SrTiO_3$ in the quaternary compositions is seen to deliver an increase in piezoelectric activity of the samples. The Curie temperature of the samples decreases with increasing amounts of $SrTiO_3$ in the compositions, but remains greater than or equal to 375° C.

TABLE 1

Properties of quaternary ceramic compositions based on 0.256[$PbTiO_3$], 0.521[$BiFeO_3$] and 0.188($K_{0.5}Bi_{0.5}$)$TiO_3$ with the specified amounts of $SrTiO_3$ added in place of $BiFeO_3$.

| Amount of $SrTiO_3$ added in place of $BiFeO_3$ (molar fraction) | $\varepsilon_r$ @ RT | $T_c$ (° C.) | $\varepsilon_r$ @ $T_c$ | $d_{33}$ (pC/N) | % Rhombohedral phase |
|---|---|---|---|---|---|
| 0 | 714 | 488 | 13200 | 175 | 52.51 |
| 0.03 | 782 | 452 | 12100 | 239 | 16.81 |
| 0.05 | 805 | 445 | 10500 | 221 | 12.76 |
| 0.075 | 826 | 398 | 12000 | 236 | 17.94 |
| 0.10 | 850 | 375 | 11500 | 233 | 15.54 |

Note also that the percentage of rhombohedral phases is greatly reduced—indicating a shift of the resultant compositions from the morphotropic phase boundary region.

Further ceramic materials of quaternary composition are obtained as described above by reintroducing an amount of $BiFeO_3$ in place of ($K_{0.5}Bi_{0.5}$)$TiO_3$ in the composition of Table 1 containing 0.075 (molar fraction) $SrTiO_3$. These compositions are optimised for piezoelectric activity through adjustment of the position in the phase diagram towards the morphotropic phase boundary.

The piezoelectric activity $d_{33}$, Curie temperature $T_C$, relative electric permittivity $\varepsilon_r$ at the Curie temperature and the coercive field $E_c$ were determined as described in detail below for four samples A to D comprising quaternary compositions containing different amounts of $SrTiO_3$.

Table 2 shows the Berlincourt $d_{33}$ value, the relative electric permittivity $\varepsilon_r$ at the Curie temperature $T_c$ and the coercive field of each sample $E_c$. As may be seen, the compositions provide good piezoelectric activity and high Curie temperature in the samples together with a high coercive field.

TABLE 2

Curie temperature ($T_c$), piezoelectric coefficient ($d_{33}$) and coercive field ($E_c$) of quaternary ceramic compositions containing 0.075 (molar fraction) strontium titanate from Table 1 in which an amount of $BiFeO_3$ is reintroduced in place of $(K_{0.5}Bi_{0.5})TiO_3$.

| Composition | Amount of $BiFeO_3$ reintroduced (molar fraction) | $T_c$ (° C.) | $d_{33}$ (pC/N) | $E_c$(kV/mm) negative | $E_c$(kV/mm) positive |
|---|---|---|---|---|---|
| A | 0.02 | 367 | 269 | −1.93 | 1.87 |
| B | 0.03 | 355 | 273 | −1.89 | 1.85 |
| C | 0.04 | 389 | 280 | −2.26 | 2.08 |
| D | 0.05 | 387 | 245 | −2.44 | 2.49 |
| X | n/a | 488 | 175 | −2.7 | 2.72 |

The $d_{33}$ values presented in Tables 1 and 2 were obtained from a Wide Range $d_{33}$ Meter (APC International, USA). The meter applies a predetermined stress and calculates the charge generated and from the stress, the "direct" piezoelectric coefficient $d_{33}$. It enables a very rapid determination of $d_{33}$ in the samples. Instructions for use of the meter can be found at the following web address: https://www.americanpiezo.com/images/stories/d_tester/d33-Meter_Instruction-Manual-updated.pdf.

The meter is turned on for a period of at least 30 minutes to ensure stability. After this, the meter is zeroed and its accuracy checked against the piezoelectric validation component supplied by the manufacturer. The sample is placed between two metal contacts and brought into contact by turning a screw until vibrations are no longer felt. After the establishment of an electrical connection, the screw is turned a further ¼ turn. The vibrational force was 250 mN.

Note that there are no standards for the calibration and validation of such meters, as the results are dependent on applied stress, geometry, frequency and stress (see, for example, National Physical Laboratory, UK, Good Practice Guide 44, ISSN 1368-6550).

The $d_{33}$ values were verified by comparison of values, taken on bars (of dimensions 1 mm by 1 mm by 3.5 mm) formed from the pellets, with PZT bar control samples measured by resonance according to CENELEC EN 50324-2:2002 (Piezoelectric Properties of Ceramic Materials and Components—Part 2: Methods of Measurement and Properties—Low Power. CENELEC (2002)). These bars were poled along the long dimension.

As mentioned above, the $d_{33}$ measured using the Berlincourt method is on average 11% higher than the values measured using the resonance method. The difference is a composite of random and systematic error, and difference in the measurements, frequency, stress and voltage.

The Curie temperatures $T_C$ and relative permittivities $\varepsilon_r$ at $T_C$ and room temperature presented in Tables 1 and 2 were determined in the normal way. The capacitance of the (unpoled) pellets was measured as a function of temperature—the Curie temperature being identified as that for maximum capacitance.

A Keysight 4299A Precision Impedance Analyser was used to measure capacitance at 1 MHz during cooling of the samples from a temperature above the Curie temperature (for example 550° C.) at a rate of 2° C. per second.

Two metre cables terminating in silver wires were used to connect to the samples. The silver wires were tensioned slightly to provide a spring contact to the sample, establishing a sound electrical connection.

A small tube furnace (Lenton LTF 12/38/250) was used to control the temperature of the samples and the temperatures were measured using a K-type thermocouple in close proximity to the sample and independently checked against a calibrated thermocouple and thermocouple monitor.

The capacitance at room temperature was measured at 1 kHz in accordance with CENELEC (2002).

The relative permittivity of the (poled) pellets at the Curie temperature and at room temperature were calculated from the measured capacitance and the geometry at the respective frequencies of 1 MHz and 1 kHz.

The coercive field was determined at 20 to 25° C. by recording polarisation-electric field loops (PE) using an AixAcct TF 2000 ferroelectric tester at a frequency of 10 Hz and an electric field between 5 and 6 kV/mm (at least double the coercive field). The coercive field is the field at which the polarisation shown in the PE loop is zero. The value Ec is taken as the average coercive field during positive and negative electric field excursions. The pellets were immersed in silicone oil to prevent electric discharge during the measurement.

The Vickers hardness $H_v$ and the fracture toughness $K_{1C}$ of each quaternary composition were determined by Vickers indentation on pellets polished using 1 μm diamond. A load of 0.3 kg was applied using a Wilson Hardness Tukon 1202 machine—calibrated and validated to DIN EN ISO 6507-2 by the manufacturer within a year of the testing. Hardness values were calculated (using a modulus of 70 GPa assumed from the $d_{33}$ resonance data) from the size of the indent and fracture toughness from the length of the propagating cracks. Ten (10) measurements per sample were taken in each case and the mean value was calculated.

The flexural strength σ was calculated from measurements made on polished (using 1 μm diamond) bars (25 mm×3 mm×0.5 mm) formed from the quaternary compositions after grinding. An Instron ElectroPuls E3000 system was used together with a 250 N load cell—the system being calibrated to ISO 7500-1:2004 by UKAS accredited Instron Calibration Laboratory (High Wycombe, UK).

A 4-point flexural testing was carried out with a lower head spacing of 20 mm, an upper head spacing of 6.66 mm and a head speed of 2 mm/min. The flexural strength, σ, was calculated from the load at failure, F, using the length of the lower head, L, and the width, b, and thickness, d, of the sample, according to the equation $\sigma = FL/(bd^2)$. Six results were collected per bar and the mean value calculated.

The Berlincourt $d_{33}$ values, the Vickers hardness, the fracture toughness and the flexural strength of each of the compositions A to D are shown in Table 3.

TABLE 3

Fracture toughness ($K_{1c}$), Vickers hardness ($H_v$) and/or flexural strength ($\sigma$) values of composition X, quaternary compositions according to the invention (A, B, C & D) and PZT materials (PZT-4, PZT PIC 151) of the prior art.

| Composition/ standard | Berlincourt $d_{33}$ (pC/N) | $K_{1c}$ (×10$^6$) [MPa.m$^{1/2}$] | Stan. Dev. | $H_v$ (×10$^9$) [kgf/mm$^2$] | Stan. Dev. | $\sigma$ (MPa) | Stan. Dev. |
|---|---|---|---|---|---|---|---|
| X | 175 | — | — | — | — | — | — |
| A | 269 | 5.2 | 0.9 | 4.1 | 0.3 | 149.3 | 2.9 |
| B | 273 | 3.9 | 0.7 | 4.5 | 0.2 | 144.4 | 5.2 |
| C | 280 | 7.6 | 1.5 | 4.1 | 0.3 | 152.5 | 4.8 |
| D | 254 | 7.2 | 1.1 | 4.2 | 0.2 | 149.8 | 1.3 |
| PZT-4 | 250* | 0.7-1.8 [1] | — | 2.5 [1] | — | — | — |
| PZT PIC 151 | 555† | — | — | — | — | 45 [2] | — |

[1] C. T. Sun and S. B. Park, "Measuring fracture toughness of piezoceramics by Vickers indentation under the influence of electric fields," *Ferroelectrics*, vol. 248, no. 1, pp. 79-95, 2000.; * not disclosed here, but calculated from the value (225 pC/N) obtained by resonance and given at https://ntrs.nasa.gov/archive/nasa/casi.ntrs.gov/19980236888.pdf.
[2] T. Fett, D. Munz, and G. Thun, "Tensile and bending strength of piezoelectric ceramics," *J. Mater. Sci. Lett.*, vol. 18, no. 23, pp. 1899-1902, 1999; † not disclosed here, but calculated from from the value 500 pC/N obtained by resonance and given at the following web address: https://www.piceramic.com/en/service/downloads/catalogs-brochures-certificates/.

Table 3 also shows the piezoelectric activity of Composition X and two ferroelectrically hard PZT materials known to the art. The Vickers hardness, the fracture toughness or the flexural strength of these materials are reported in the indicated references ([1] and [2]). The piezoelectric activity of these materials is found in data otherwise available to the skilled person.

Note that the fracture toughness, the Vickers hardness and the flexural strength can be compared with the indicated references notwithstanding that slightly different methods and some variation in the equipment and load are used, because the reported fracture toughness and flexural strength values for PZT-4 and PZT PIC 151 are obtained on multiple samples across a wide range of loads.

As can be seen in Table 3, the quaternary compositions according to the invention show significantly higher fracture toughness $K_{1C}$ as compared to PZT-4 and PZT PIC 151 (3 MNm$^{-3/2}$ or more as compared to less than 1 MNm$^{-3/2}$). Furthermore, the quaternary compositions exhibit higher Vickers hardness and higher flexural strength than is observed for PZT (other literature references suggest PZTs flexural strength varies between 50 and 86 MPa).

Figure 6:
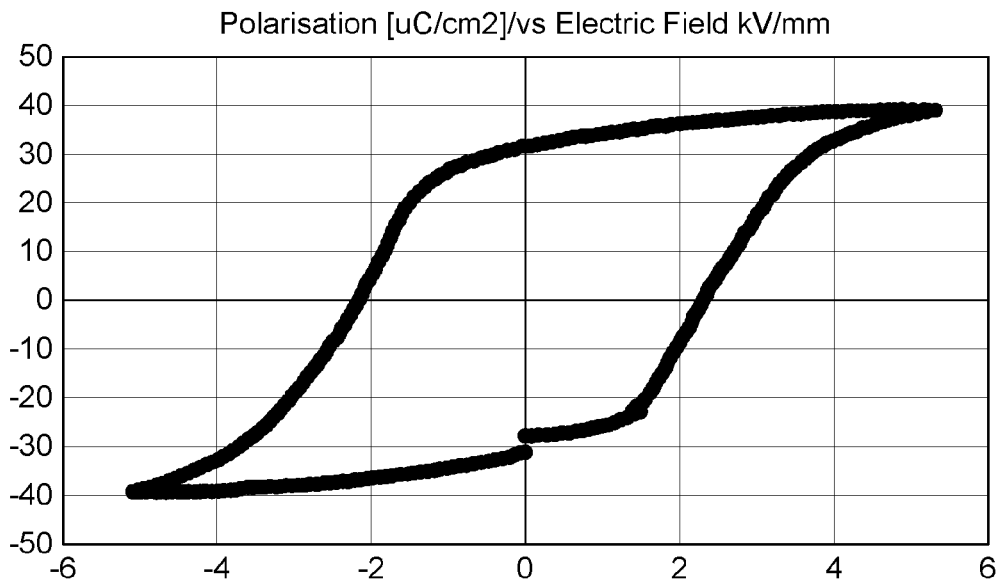
FIG. 6 is a polarisation-field loop for a ceramic comprising a quaternary composition C (in Tables 2 and 3 below) of 0.25625[PbTiO$_3$]-0.075[SrTiO$_3$]-0.52125[BiFeO$_3$]-0.1475 [(K$_{0.5}$Bi$_{0.5}$)TiO$_3$] which is collected at 10 Hz and room temperature.

FIG. 6 is a polarisation-field loop for a ceramic comprising the quaternary composition C (of Tables 2 and 3) 0.25625[PbTiO$_3$]-0.075[SrTiO$_3$]-0.52125[BiFeO$_3$]-0.1475 [(K$_{0.5}$Bi$_{0.5}$)TiO$_3$] collected at 10 Hz and room temperature. As may be seen, the remanent polarisation is similar to that observed in PZT.

Figure 7:
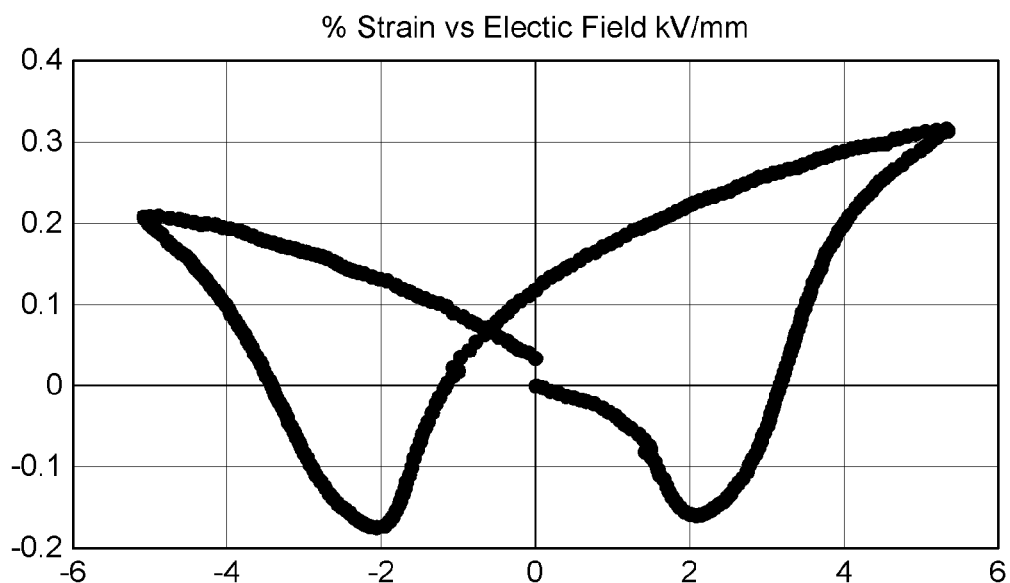
FIG. 7 is a bipolar strain-field loop for the ceramic comprising the quaternary composition C collected at 10 Hz and room temperature.

FIG. 7 is a bipolar strain-field loop for the ceramic comprising the quaternary composition C collected at 10 Hz and room temperature. As may be seen, the total peak to peak strain is 0.49%.

Figure 8:
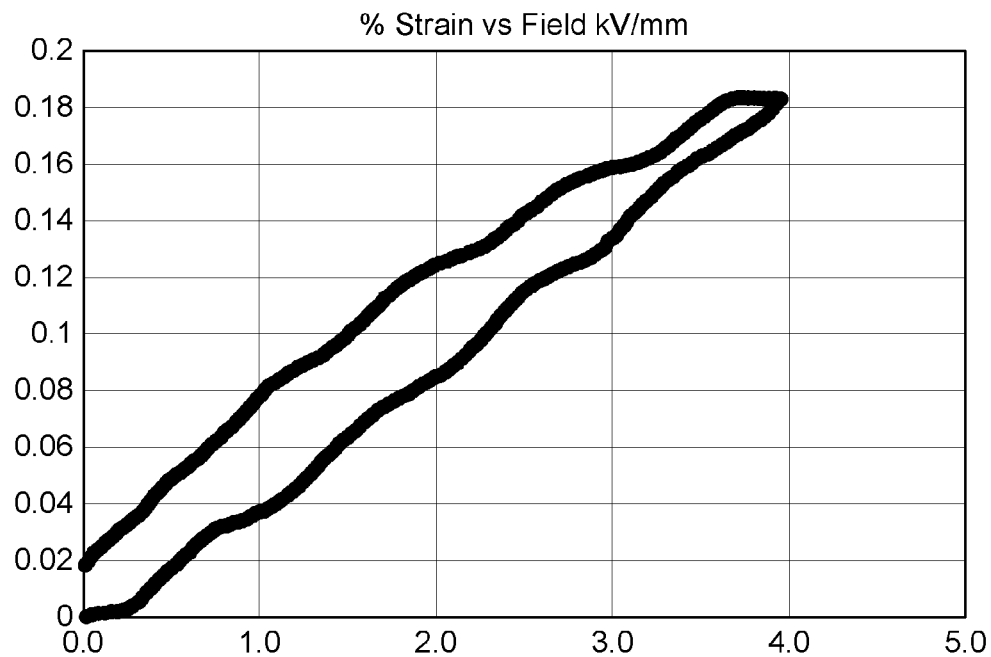
FIG. 8 is a unipolar strain-field loop for the ceramic comprising the quaternary composition C collected at 1 Hz and room temperature.

FIG. 8 is a unipolar strain-field loop for the ceramic comprising the quaternary composition C collected at 1 Hz and room temperature. As may be seen, the total strain exceeds 0.18% at 4 kV/mm and the high field $d_{33}$ (max strain/max field) is 431 pm/V.

Figure 9:
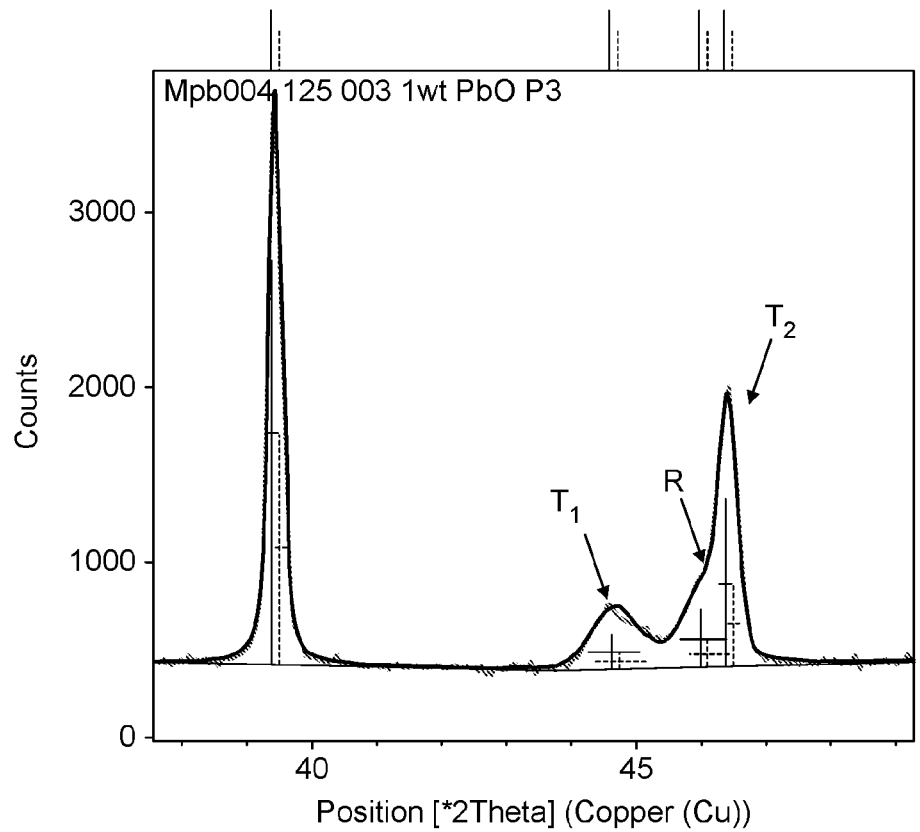
FIG. 9 is an X-ray diffraction pattern of the ceramic comprising the quaternary composition C. The pattern is used to calculate the difference in volumes of the tetrahedral and rhombohedral unit cells.

FIG. 9 shows a powder X-ray crystallography analysis of the ceramic comprising the quaternary composition C, viz., of a ceramic with a good combination piezoelectric activity, high Curie temperature, fracture toughness, high flexural strength and Vickers hardness.

The analysis was to define (a) the relative proportions of each of the tetrahedral and rhombohedral phases and (b) the size/volume of each unit cell type. The difference in primitive unit cell size between tetragonal and rhombohedral phase is known as a pre-requisite for an enhanced transformation toughening mechanism (as described in T. P. Comyn, T. Stevenson, S. A. Qaisar, A. J. Bell, "High performance piezoelectric materials" Actuator 2012) which underlies the highly improved fracture toughness of the ceramics of the present invention.

In FIG. 9 the peaks at ca. 44.6° and 46.4° relate to the tetragonal phase, and the single peak at ca. 46° relates to the rhombohedral phase. From these positions the difference in the volumes of the rhombohedral and tetragonal phases was calculated at 1.24%.

Note that the techniques described in detail here can be applied broadly and do not necessarily limit the scope of the invention. A further refinement of the process by which the material of composition C is performed may, for example, lead to further improvements in the material properties of the ceramic.

The invention claimed is:

1. A piezoelectric ceramic comprising:
    a first portion poled in a first direction; and
    a second portion poled in a second direction opposite to the first direction, the first and second portions being in contact with each other,
    wherein the first portion and the second portion comprise:
        a Berlincourt $d_{33}$ value ≥250 pm/V;
        a Curie temperature, $T_c$, of ≥300° C.; and
        a fracture toughness, $K_{1c}$ (×10$^6$), of ≥3 MPa×m$^{1/2}$.

2. A piezoelectric ceramic according to claim 1 wherein the first portion and the second portion further comprise at least one of:
    a coercive field, Ec, of ≥|1.75| kV/mm;
    a Vickers hardness, $H_v$, (×10$^9$)≥3.5 kgf/mm$^2$; or
    a flexural strength, $\sigma$, ≥100 MPa.

3. A piezoelectric ceramic having a composition of: a[PbTiO$_3$]-b[SrTiO$_3$]-c[BiFeO$_3$]-d[(K$_x$Bi$_{1-x}$)TiO$_3$], wherein:
    0.4≤x≤0.6, 0.1≤a≤0.4, 0.01≤b≤0.2, c≥0.05, d 0.01, and a+b+c+d=1
    the piezoelectric ceramic comprises:
        a first portion poled in a first direction;
        a second portion poled in a second direction opposite to the first direction:
        at least one of an A- metal site dopant or a B- metal site dopant in an amount up to 2 at. % per respective metal site;
        a Berlincourt $d_{33}$ value ≤ 250 pm/V;
        a Curie temperature, $T_c$, of ≥ 300° C.; and
        a fracture toughness, $K_{1c}$ (×10$^6$), of ≥3 MPa×m$^{1/2}$.

4. The piezoelectric ceramic of claim 3 wherein the piezoelectric ceramic deforms in a chevron configuration in response to a drive waveform.

5. A piezoelectric ceramic according to claim 3, wherein: 0.3≤c≤0.7; and 0.05≤d≤0.25.

6. A piezoelectric ceramic according to claim 3, wherein 0.2≤a≤0.3.

7. A piezoelectric ceramic according to claim 3, wherein 0.02≤b≤0.15.

8. A piezoelectric ceramic according to claim 3, wherein: 0.23≤a≤0.27; and 0.025≤b≤0.10.

9. A piezoelectric ceramic according to claim 3, wherein: 0.4≤c≤0.6; and 0.1≤d≤0.2.

10. A piezoelectric ceramic according to claim 3, wherein x is 0.5.

11. A piezoelectric ceramic according to claim 3, wherein the at least one of an A- metal site dopant or a B- metal site dopant comprises at least one of Ti, Zr, W, Nb, V, Ta, Mo, or Mn.

12. A piezoelectric ceramic according to claim 11, wherein the at least one of an A- metal site dopant or a B- metal site dopant comprises at least one of Mn or Nb and is present in an amount of from 0.25 at. % to 2 at. % per respective metal site.

13. A piezoelectric ceramic according to claim 1, wherein the piezo electric ceramic is a solid solution substantially free of non-perovskite phases comprising $PbTiO_3$, $SrTiO_3$, $BiFeO_3$ and $(K_xBi_{1-x})TiO_3$ wherein 0.4≤x≤0.6.

14. The piezoelectric ceramic of claim 1, wherein:
the first direction and the second direction are substantially parallel to a height direction of a pair of parallel electrodes in contact with the first portion and the second portion.

15. The piezoelectric ceramic of claim 1, wherein:
the first portion and the second portion are each in contact with a pair of electrodes configured to apply an electric field to the piezoelectric ceramic; and
the first direction and the second direction are substantially perpendicular to the applied electric field.

16. The piezoelectric ceramic of claim 15, wherein a distance between the pair of electrodes is less than 60 micrometers.

17. The piezoelectric ceramic of claim 1, wherein:
the first portion and the second portion deform in shear mode in opposite senses in response to a voltage.

18. A piezoelectric ceramic having a composition of:
$a[PbTiO_3]$-$b[SrTiO_3]$-$c[BiFeO_3]$-$d[(K_xBi_{1-x})TiO_3]$,
wherein:
0.4≤x≤0.6, 0.2≤a≤0.3; 0.025≤b≤0.125; 0.4≤c≤0.6; 0.05≤d≤0.25, and a+b+c+d=1;
b is selected so the piezoelectric material has a Berlincourt $d_{33}$ value greater than 250 pm/V;
c is selected so the piezoelectric material has a Curie temperature greater than 300° C.; and
the piezoelectric ceramic comprises a first portion poled in a first direction and a second portion poled in a second direction opposite to the first direction.

19. The piezoelectric ceramic of claim 18, wherein:
0.24≤a≤0.26; 0.05≤b≤0.10; 0.46≤c≤0.58; 0.08≤d≤0.21.

* * * * *

UNITED STATES PATENT AND TRADEMARK OFFICE
CERTIFICATE OF CORRECTION

PATENT NO. : 11,873,253 B2
APPLICATION NO. : 16/612903
DATED : January 16, 2024
INVENTOR(S) : Michael Watson et al.

It is certified that error appears in the above-identified patent and that said Letters Patent is hereby corrected as shown below:

In the Claims

Claim 3, Column 20, Line 56, "d 0.01" should read --$d \geq 0.01$--.

Claim 3, Column 20, Line 61, "the first direction:" should read --the first direction;--.

Claim 3, Column 20, Line 65, "a Berlincourt $d_{33}$ value $\leq$ 250 pm/V;" should read --a Berlincourt $d_{33}$ value $\geq$ 250 pm/V;--.

Claim 18, Column 22, Line 20, "$0.4 \leq \times 0.6$" should read --$0.4 \leq \times \leq 0.6$--.

Signed and Sealed this
Second Day of April, 2024

*Katherine Kelly Vidal*
Katherine Kelly Vidal
*Director of the United States Patent and Trademark Office*